United States Patent
Hayashi et al.

(10) Patent No.: US 6,590,511 B2
(45) Date of Patent: Jul. 8, 2003

(54) RETRIEVABLE MEMORY CAPABLE OF OUTPUTTING A PIECE OF DATA WITH RESPECT TO A PLURALITY OF RESULTS OF RETRIEVE

(75) Inventors: Isamu Hayashi, Hyogo (JP); Takeshi Fujino, Hyogo (JP); Hideyuki Noda, Hyogo (JP); Hiroki Shimano, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/775,711

(22) Filed: Feb. 5, 2001

(65) Prior Publication Data

US 2002/0027514 A1 Mar. 7, 2002

(30) Foreign Application Priority Data

Sep. 1, 2000 (JP) .......................... 2000-265078

(51) Int. Cl.⁷ ................................. H03M 7/00
(52) U.S. Cl. ................ 341/106; 341/51; 341/65; 341/67; 341/90; 711/101
(58) Field of Search ............... 341/67, 106, 50, 341/108, 51, 65, 90; 364/925.2; 711/101

(56) References Cited

U.S. PATENT DOCUMENTS

| | | | | |
|---|---|---|---|---|
| 4,622,653 A | * | 11/1986 | McElroy | 365/49 |
| 5,101,376 A | * | 3/1992 | Noguchi et al. | 364/925.6 |
| 5,155,489 A | * | 10/1992 | Gulczynski | 341/160 |
| 6,240,485 B1 | * | 5/2001 | Srinivasan et al. | 711/108 |
| 6,252,821 B1 | * | 6/2001 | Nizar et al. | 711/202 |

FOREIGN PATENT DOCUMENTS

JP          4-11390          1/1992

* cited by examiner

*Primary Examiner*—Michael Tokar
*Assistant Examiner*—Linh V Nguyen
(74) *Attorney, Agent, or Firm*—McDermott, Will & Emery (57) ABSTRACT

A retrievable memory is provided with a priority encoder. The priority encoder is constituted by encoder units. Each of the encoder units is constituted by an inverter, N-channel MOS transistors and an AND gate. Upon receipt of a signal of H level from a matching line, the encoder unit outputs a signal of H level to a word line, and also outputs a signal of L level to a matching line active signal line MLA1. Then, the encoder units respectively output signals of L level to the word lines. Consequently, even when a plurality of results of a retrieving process are obtained, it is possible to output single data.

3 Claims, 8 Drawing Sheets

RETRIEVABLE MEMORY CAPABLE OF OUTPUTTING A PIECE OF DATA WITH RESPECT TO A PLURALITY OF RESULTS OF RETRIEVE

BACKGROUND OF THE INVENTION

1. Field of the Invention

The present invention relates to a retrievable memory having a variable data structure to be retrieved, and more particularly concerns a retrievable memory which eliminates the need for addresses of data to be retrieved.

2. Description of the Background Art

Figure 8:
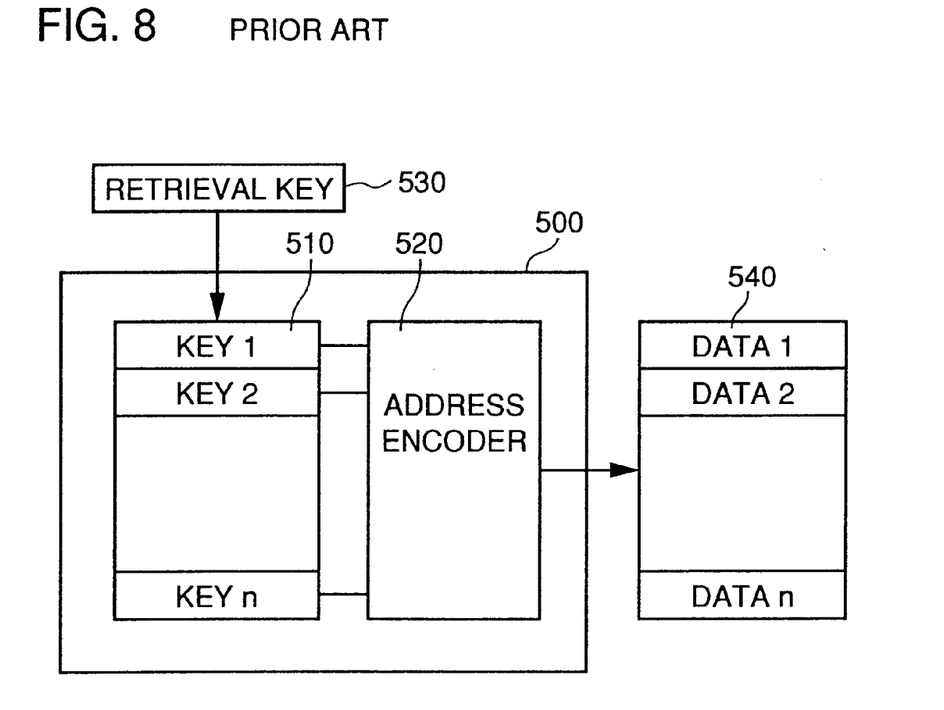
FIG. 8 is a schematic block diagram of a conventional data retrieval system.

FIG. 8 shows a conventional data retrieve system using a CAM (Content Addressable Memory). The conventional data retrieval system has a CAM 500 and a memory 540. The CAM 500 is constituted by a memory 510 and an address encoder 520. The memory 510 stores a plurality of key data. The memory 540 stores a plurality of content data corresponding to the key data in the memory 510. Upon receipt of a signal representative of key data matched with a retrieval key 530 from a memory 510, the address encoder 520 specifies an address in the memory 540 storing the data corresponding to the matched key data.

In the conventional data retrieval system, when a retrieval key 530 is inputted to a memory 510 of the CAM 500, the memory 510 extracts key data that is matched with the retrieval key 530. Then, the memory 510 outputs an activation signal for activating the extracted key data to the address encoder 520.

Then, based upon the inputted activation signal, the address encoder 520 generates an address of the content data corresponding to the key data matched with the retrieval key, and outputs the address thus generated to the memory 540. The memory 540 outputs the content data stored in the site specified by the inputted address.

In this manner, in the conventional data retrieval system, the key data that is matched with a retrieval key 530 is extracted, and the retrieved content data is read out through generating an address for specifying the content data corresponding to the extracted key data.

Thus, in the conventional data retrieval system, a monodirectional data retrieve is carried out, that is, the content data is read out based upon the key data.

However, in the conventional data retrieval system, when the retrieval key 530 is matched with a plurality of key data, a plurality of content data are outputted from the memory 540, resulting in a failure in obtaining a single content data.

SUMMARY OF THE INVENTION

In order to solve the above-mentioned problem, the objective of the present invention is to provide a retrievable memory which can output a single data even when a plurality of results of retrieve are obtained.

A retrievable memory in accordance with the present invention includes a first memory storing n number (n: natural number) of key data, and outputting a matching signal when inputted retrieval key information is matched with stored key data; a second memory storing n number of content data corresponding to n number of key data; and a priority encoder specifying, upon receipt of matching signal, content data stored in second memory corresponding to key data that is matched with retrieval key information, wherein priority encoder outputs a specifying signal that specifies single content data when a plurality of matching signals are inputted from first memory, and second memory outputs the content data specified by specifying signal.

In the retrievable memory of the present invention, when the retrieval key information is matched with key data stored in the first memory, the first memory outputs a matching signal to the priority encoder, and the priority encoder specifies content data stored in the second memory that corresponds to the key data matched with the retrieval key information. Moreover, upon receipt of a plurality of matching signals outputted from the first memory, the priority encoder specifies single content data. Then, the second memory outputs the content data specified by the priority encoder.

Therefore, in accordance with the present invention, single content data is outputted even when a plurality of results of retrieve are obtained.

Moreover, in accordance with the present invention, it is not necessary to generate an address for reading out content data corresponding to the key data matched with the retrieval key data, and it is possible to reduce the area of the retrievable memory.

More preferably, in a retrievable memory, the first memory stores n number of key data in an ordered manner, and the priority encoder outputs a specifying signal for specifying content data corresponding to the lowest order key data among m number (m: natural number not more than n) of key data matched with the retrieval key information when m number of matching signals are inputted from the first memory.

In the case when a plurality of matching signals are inputted from the first memory, the priority encoder specifies content data corresponding to the lowest order key data among a plurality of key data matched with the retrieval key data. Then, the second memory outputs the content data specified by the priority encoder.

Therefore, in accordance with the present invention, even when a plurality of results of retrieve are obtained, it is possible to output single content data.

More preferably, in a retrievable memory, the first memory outputs m number of first logical signals and n–m number of second logical signals when the retrieval key information matches with m number of key data, the priority encoder outputs in response to a first logical signal an activation signal for reading out content data corresponding to the lowest order key data to the second memory, and the second memory outputs content data corresponding to said lowest order key data based on said activation signal, the first logical signal is generated in accordance with the lowest order key data among said m number of first logical signals.

When the retrieval key data is matched with the key data, the first memory outputs the first logical signal, and when the data is not matched with the key data, it outputs the second logical signal. Then, the priority encoder outputs the activation signal used for reading the corresponding content data based upon the first logical signal. Moreover, upon receipt of a plurality of first logical signals from the first memory, the priority encoder outputs an activation signal used for reading content data corresponding to the lowest order key data among key data matched with the retrieval key data. Then, based upon the activation signal, the second memory outputs the content data corresponding to the key data. Therefore, in accordance with the present invention, even when a plurality of results of retrieval are obtained, single content data is outputted by the logical signal.

Moreover, the retrievable memory in accordance with the present invention includes a first memory storing n number (n: natural number) of key data, and outputting a first matching signal when inputted retrieval key information is matched with stored key data; a second memory storing n number of content data corresponding to n number of key data, and outputting a second matching signal when inputted content retrieval information is matched with stored content data; a priority encoder specifying, upon receipt of the first matching signal, the content data stored in the second memory corresponding to the key data matched with said retrieval key information, and specifying, upon receipt of the second matching signal, key data stored in the first memory corresponding to the content data matched with the content retrieval information, wherein the priority encoder outputs a first specifying signal for specifying single content data upon receipt of a plurality of first matching signals, and outputs a second specifying signal for specifying single key data upon receipt of a plurality of second matching signals, the second memory outputs the content data specified by the first specifying signal, and the first memory outputs the key data specified by the second specifying signal.

In the retrievable memory in accordance with the present invention, when retrieval key information is matched with key data stored in the first memory, the first memory outputs a first matching signal to the priority encoder, and the priority encoder specifies content data stored in the second memory that corresponds to the key data matched with the retrieval key information. Moreover, upon receipt of a plurality of first matching signals from the first memory, the priority encoder specifies single content data. Then, the second memory outputs the content data specified by the priority encoder. Here, in the retrievable memory, when the content retrieval information is matched with the content data stored in the second memory, the second memory outputs the second matching signal to the priority encoder, and the priority encoder specifies key data stored in the first memory corresponding to the content data matched with the content retrieval information. Moreover, upon receipt of a plurality of second matching signals from the second memory, the priority encoder specifies single key data. Then, the first memory outputs the key data specified by the priority encoder. Therefore, in accordance with the present invention, a bidirectional retrieving process is available between the key data and the content data, and even when a plurality of results of retrieval are obtained, single content data or key data can be outputted.

More preferably, in a retrievable memory, the first memory stores n number of key data in an ordered manner, the second memory stores n number of content data in an ordered manner, and the priority encoder outputs a first specifying signal for specifying content data corresponding to the lowest order key data among m number (m: natural number not more than n) of key data matched with the retrieval key information when m number of the first matching signals are inputted from the first memory, and outputs a second specifying signal for specifying key data corresponding to the lowest order content data among k number (k: natural number not more than n) of content data matched with the content retrieval information when k number of the second matching signals are inputted from the second memory.

Upon receipt of a plurality of the first matching signals from the first memory, the priority encoder specifies content data corresponding to the lowest order key data among the plurality of key data matched with the retrieval key data. Then, the second memory outputs the content data specified by the priority encoder. Moreover, upon receipt of a plurality of the second matching signals from the second memory, the priority encoder specifies key data corresponding to the lowest order content data among the plurality of content data matched with the content retrieval data. Then the first memory outputs the key data specified by the priority encoder.

Therefore, in accordance with the present invention, in the bidirectional retrieval system between the key data and the content data, even when a plurality of results of retrieval are obtained, it is possible to output single content data.

More specifically, in a retrievable memory, the first memory outputs m number of first logical signals and n–m number of second logical signals when the retrieval key information is matched with m number of key data, the second memory outputs k number of third logical signals and n–k number of fourth logical signals when the content retrieval information is matched with k number of content data, the priority encoder outputs in response to the first logical signal a first activation signal for reading out the content data corresponding to the lowest order key data to the second memory, and outputs in response to the third logical signal a second activation signal for reading out the key data corresponding to the lowest order content data to the first memory, the first memory outputs the key data corresponding to the lowest order content data based on the second activation signal, and the second memory outputs the content data corresponding to the lowest order key data based on the first activation signal, the first logical signal is generated in accordance with the lowest order key data among the inputted m number of first logical signals, the third logical signal is generated in accordance with the lowest order key data among the inputted k number of third logical signals.

The first memory outputs the first logical signal when the retrieval key data is matched with the key data, and it outputs the second logical signal when not matched with the key data. Then, the priority encoder outputs, based upon the first logical signal, the first activation signal used for reading out the corresponding content data to the second memory. Moreover, upon receipt of a plurality of the first logical signals from the first memory, the priority encoder outputs the first activation signal used for reading out the content data corresponding to the lowest order key data among the key data matched with the retrieval key data to the second memory. Then, based upon the first activation signal, the second memory outputs the content data corresponding to the key data.

Moreover, the second memory outputs the third logical signal when the content retrieval data is matched with the content data, and it outputs the fourth logical signal when not matched with the content data. Then, the priority encoder outputs, based upon the third logical signal, the second activation signal used for reading out the corresponding key data to the first memory. Moreover, upon receipt of a plurality of the third logical signals from the second memory, the priority encoder outputs the second activation signal used for reading out key data corresponding to the lowest order content data among the content data matched with the content retrieval data to the first memory. Then, the first memory outputs the key data corresponding to the content data based upon the second activation signal.

Therefore, in accordance with the present invention, in the bidirectional retrieval system between the key data and the content data, it is possible to output single content data by using the logical signal even when a plurality of results of retrieve are obtained.

Moreover, the retrievable memory in accordance with the present invention includes a first memory storing a plurality of pairs of key data each consisting of first key data and second key data, and outputting a first or second matching signal when retrieval key information is matched with the first or second key data stored therein; a second memory storing a plurality of content data corresponding to the plurality of first and second key data; and a priority encoder specifying, upon receipt of the first or second matching signal, the content data stored in the second memory corresponding to the first or second key data, wherein the priority encoder outputs a first specifying signal for specifying the content data stored in the second memory corresponding to a pair of first and second key data among the plurality of first and second key data that are matched with the retrieval key information when the plurality of first and second matching signals are inputted and when a selection signal has a first logic, and outputs a second specifying signal for specifying the content data stored in the second memory corresponding to a first or second key data among first or second key data that are matched with the retrieval key information when the plurality of first and second matching signals are inputted and when the selection signal has a second logic, and the second memory outputs the content data specified by the first or second specifying signal.

In the retrievable memory in accordance with the present invention, the key data is constituted by a pair of key data consisting of first key data and second key data. When the key data is matched with the retrieval key data, the first memory outputs matching signals independently with respect to the first key data and the second key data; consequently, the priority encoder specifies content data corresponding to the first and second key data or content data corresponding to either the first or second key data. Then, the second memory outputs the content data specified by the priority encoder.

Therefore, in accordance with the present invention, in a retrieval system capable of retrieving while selectively changing the length of the retrieval key data, it is possible to output single content data even when a plurality of results of retrieve are obtained.

More preferably, in a retrievable memory, the first memory stores a pair of first and second key data in an ordered manner, and the priority encoder outputs, based on the plurality of first and second matching signals and the selection signal with first logic, a first specifying signal for specifying the content data stored in the second memory corresponding to the first and second key data in the lowest order among the plurality of first and second key data that matched with the retrieval key information, and outputs, based on the plurality of first and second matching signals and said selection signal with second logic, a second specifying signal for specifying the content data stored in the second memory corresponding to first and second key data in the lowest order among first and second key data that matched with the retrieval key information.

Upon receipt of a plurality of matching signals, the priority encoder specifies the content data corresponding to the lowest order key data among the key data matched with the retrieval key data, independent of the length of the retrieval key data. Then, the second memory outputs the content data specified by the priority encoder.

Therefore, in accordance with the present invention, in a retrieval system capable of retrieving while selectively changing the length of the retrieval key data, it is possible to output single content data even when a plurality of results of retrieve are obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Referring to Figures, the following description will discuss embodiments of the present invention. Here, those members that have the same or corresponding functions are indicated by the same reference numerals and the description thereof is not repeated.

First Embodiment

Figure 1:
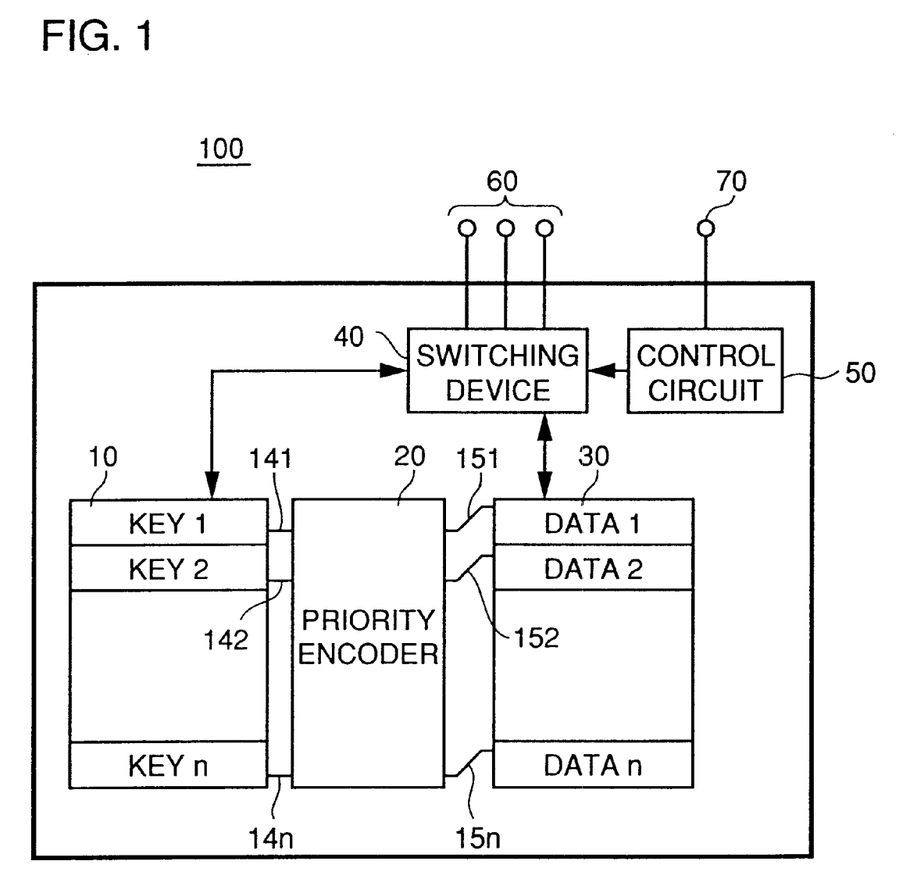
FIG. 1 is a schematic block diagram of a retrievable memory in accordance with the first embodiment of the present invention.

Referring to FIG. 1, a retrievable memory 100 in accordance with the present invention is provided with memories 10 and 30, a priority encoder 20, a switching device 40 and a control circuit 50. The priority encoder 20 is connected to the memory 10 by matching lines 141 to 14$n$, and is also connected to the memory 30 by ward lines 151 to 15$n$.

The memory 10 stores key data. The memory 30 stores content data corresponding to the key data stored in the memory 10. Upon receipt of a matching signal indicating that a retrieval key is matched with key data from the memory 10 through the matching line 141 to 14$n$ by the below described method, the priority encoder 20 outputs a specifying signal for specifying content data stored in the memory 30 that corresponds to the matched key data to the memory 30 through the word line 151 to 15$n$.

Based upon a control signal from the control circuit 50, the switching device 40 outputs a retrieval key inputted through an input-output terminal 60 to the memory 10, and outputs content data read from the memory 30 to an external device through the input-output terminal 60. Moreover, based upon the control signal from the control circuit 50, the switching device 40 outputs key data to the memory 10 so as to be stored therein, and outputs content data to the memory 30 so as to be stored therein.

The control circuit 50 outputs a control signal inputted through a control terminal 70 to the switching device 40.

Figure 2:
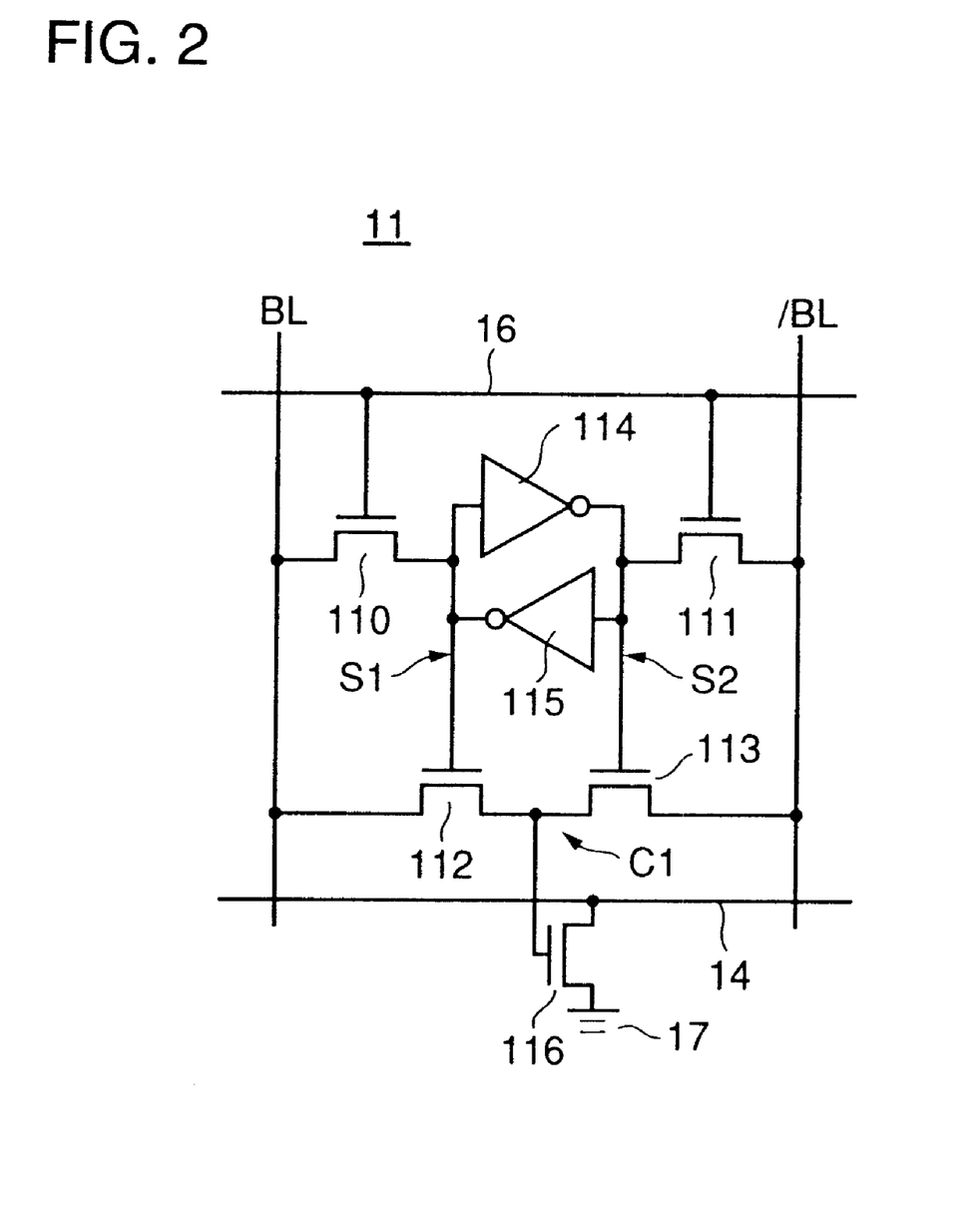
FIG. 2 is a circuit diagram of a unit memory cell contained in the retrievable memory shown in FIG. 1.

Referring to FIG. 2, an explanation will be given of a unit memory cell 11 constituting the memory 10. The unit memory cell 11 is constituted by N-channel MOS transistors 110 to 113 and 116, and inverters 114 and 115. The N-channel MOS transistor 110 has its gate terminal connected to the word line 16, its source terminal connected to a bit line BL, and its drain terminal connected to a node S1. The N-channel MOS transistor 111 has its gate terminal connected to the word line 16, its source terminal connected to a bit line/BL, and its drain terminal connected to a node S2.

The inverter 114 has its input terminal connected to the node S1 and its output terminal connected to the node S2. The inverter 115 has its input terminal connected to the node S2 and its output terminal connected to the node S1. In other words, the inverter 114 and the inverter 115 are connected between the node S1 and the node S2 complimentarily.

The N-channel MOS transistor 112 has its gate terminal connected to the node S1, its source terminal connected to bit line BL and its drain terminal connected to a node C1. The N-channel MOS transistor 113 has its gate terminal connected to the node S2, its source terminal connected to the bit line/BL and its drain terminal connected to the node C1. The N-channel MOS transistor 116 has its gate terminal connected to the node C1, its source terminal connected to the matching line 14 and its drain terminal connected to a grounding node 17.

In the same manner as in a normal SRAM (Static Random Access Memory), a data writing operation is carried out on the unit memory cell 11 by activating the N-channel MOS transistors 110 and 111 so as to write data in the bit lines BL and /BL with the word line 16 being maintained in H (logical High) level.

Moreover, a data reading operation is carried out from the unit memory cell 11 by activating the N-channel MOS transistors 110 and 111 so as to detect an electric potential difference between the bit lines BL and /BL with the word line 16 being maintained in H level.

In order to compare the data maintained by the unit memory cell 11 is matched with data inputted from an external device, the matching line 14 is first precharged to H level, and an inverted signal of retrieval key data is inputted to the bit lines BL and /BL. For example, if it is assumed that a unit memory cell 11 maintains "1" as key data; then the node S1 is "1", and the node S2 is "0". In this state, "1" is given as the retrieval data, that is, "0" is given to the bit line BL, and "1" is given to the bit line /BL.

Then, since the N-channel MOS transistor 112 is maintained "ON", the node C1 becomes "0", thereby turning off the N-channel MOS transistor 116. Consequently, the matching line 14 is maintained in H level. In other word, it is indicated that the retrieval key data is matched with the stored key data.

In contrast, in the case when "0" is given as the retrieval data, that is, "1" is given to the bit line BL and "0" is given to the bit line /BL, since the N-channel MOS transistor 112 is maintained "ON", the node C1 becomes "1", thereby turning on the N-channel MOS transistor 116. Consequently, the matching line 14 becomes L (logical Low) level. In other words, it is indicated that the retrieval key data is not matched with the stored key data.

In the case when the data stored in the unit memory cell 11 is "0", comparison is made as to whether or not the retrieval key data is matched with the stored key data in the same manner.

Since the unit memory cell 11 stores one bit of key data, the memory 10 has an arrangement in which the unit memory cells 11 the number of which corresponds to the number of bits of key data are connected to one piece of the key data with the matching line 14 and the word line 16 being commonly used. For example, in the case of the key data of 8 bits, with respect to one piece of the key data, 8 unit memory cells 11 are connected thereto, with the matching line 14 and the word line 16 being commonly used. When all the 8 bits of retrieval key data inputted from outside are matched with the key data stored in the respective 8 unit memory cells 11, the matching line 14 is allowed to go high, thereby indicating that the retrieval key data is matched with the key data stored in the respective 8 unit memory cells. Moreover, in the case when, among the 8 bits of the retrieval key data, even one bit is not matched with the key data stored in the unit memory cells 11, the matching line 14 goes low, thereby indicating that the retrieval key data is not matched with the key data stored in the respective 8 unit memory cells.

Referring again to FIG. 1, the memory 10 stores each of the m-bit key data 1 to n in the memory cells formed by connecting m number of the unit memory cells 11. When the inputted retrieval key data is matched with the stored key data, matching lines 141 to 14n, connected to the memory cells formed by connecting the m number of the unit memory cells 11 that store the key data matched with the retrieval key data, are allowed to go high. In other words, the memory formed by connecting the m number of the unit memory cells 11 that store the key data matched with the retrieval key data outputs signals of H level to the matching lines 141 to 141n. For example, when the key data 2 matches with the retrieval key data, the memory cells storing the key data 2 output signals of H levels to the matching line 142.

Moreover, the memory 10 stores the key data 1 to n in an ordered manner. In other words, the key data 1 is the lowest order key data, and the order goes higher as the key data number increases like 2, 3, 4, . . .

Figure 3:
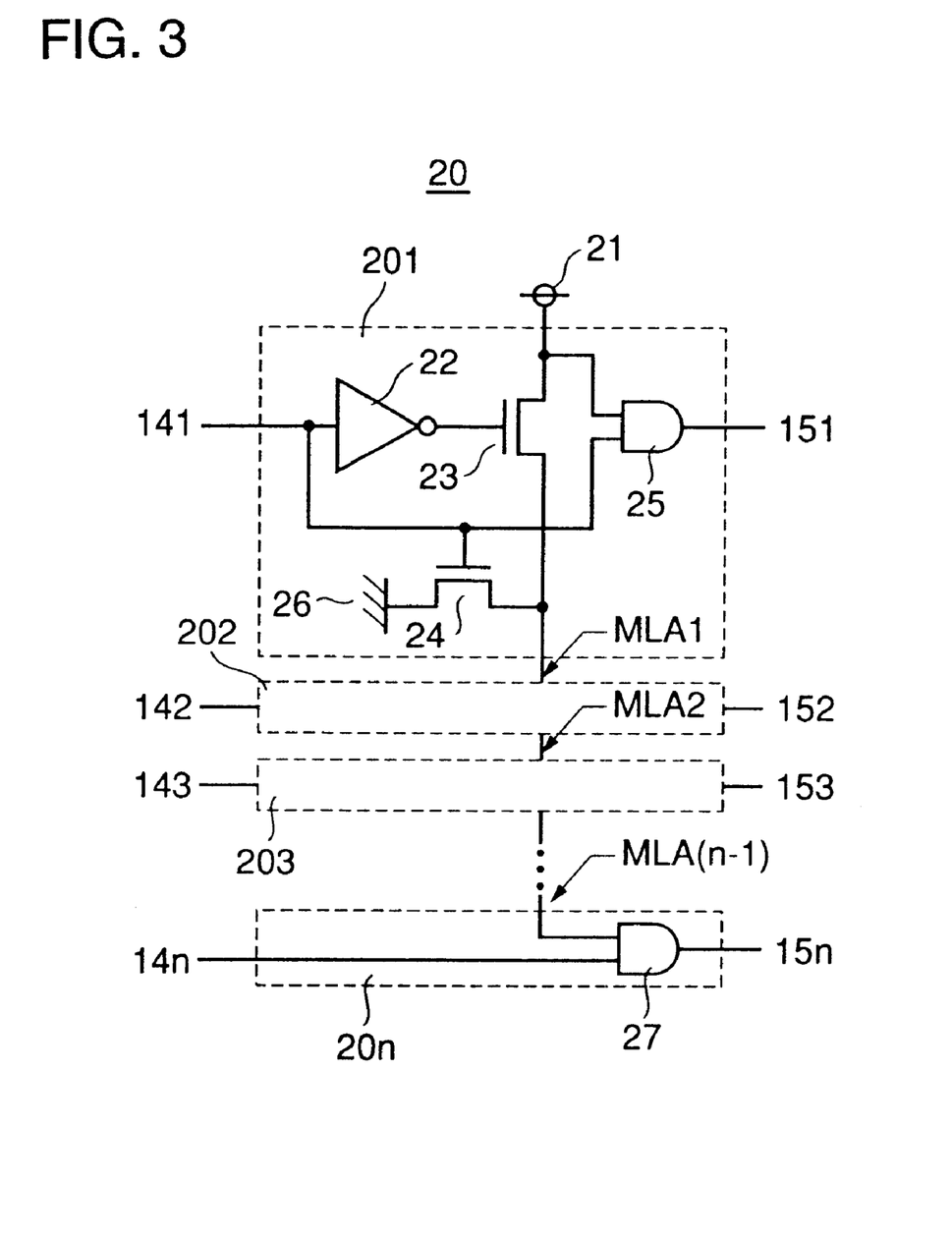
FIG. 3 is a circuit diagram of a priority encoder in the retrievable memory shown in FIG. 1.

Referring to FIG. 3, the priority encoder 20 is constituted by n number of encoder units 201 to 20n. The encoder unit 201 is constituted by an inverter 22, N-channel MOS transistors 23 and 24 and an AND gate 25. The N-channel MOS transistor 23 has its gate terminal connected to the output terminal of the inverter 22, its source terminal connected to a power supply node 21 and its drain terminal connected to a matching line active signal line MLA1. The N-channel MOS transistor 24 has its gate terminal connected to the matching line 141, its source terminal connected to a grounding node 26 and its drain terminal connected to the matching line active signal line MLA1.

The inverter 22 receives a signal on the matching line 141 as an input signal. The AND gate 25 receives the signal on the matching line 141 and an H-level signal from the power supply node 21 as input signals.

The encoder units 202 to 20n-1, which have the same circuit construction as the encoder unit 201, respectively receive signals on the matching line active signal lines MLA1 to MLAn-2 outputted from the lower order encoder units 201 to 20n-2 and signals on the matching lines 142 to 14n-1 as input signals.

The encoder unit 20n, made of AND gates 27, receive signals on the matching line active signal lines MLAn-1 of the encoder units 20n-1 and signals on the matching lines 14n as input signals.

Upon receipt of a signal of H level from the matching line 141, the inverter 22 outputs a signal of L level, thereby turning the N-channel MOS transistor 23 off. Then, the N-channel MOS transistor 24 is turned on so that a signal of L level is outputted to the matching line active signal line MLA1. Moreover, based upon a signal of H level from the power supply node 21 and a signal of H level on the matching line 141, the AND gate 25 outputs a signal of H level to the word line 151.

Since a signal of L level is inputted to the AND gate from the matching line active signal line MLA1, the encoder unit 202 outputs a signal of L level to the word line 152. Moreover, upon receipt of a signal of H level from the matching line 142, the encoder unit 202 outputs a signal of L level to the matching line active signal line MLA2. Moreover, upon receipt of a signal of L level from the matching line 142, the encoder unit 202 outputs a signal of L level to the matching line active signal MLA2 for turning the N-channel MOS transistor on. In other words, when the encoder unit 201 outputs a signal of L level to the matching line active signal line MLA1, the encoder unit 202 outputs a signal of L level to the word line 152 and the matching line active signal line MLA2, independent of whether or not the input signal from the matching line 142 is high or low. The same is true for the encoder units 203 to 20n.

Moreover, in the encoder unit 201, upon receipt of a signal of L level from the matching line 141, the inverter 22 outputs a signal of H level, the N-channel MOS transistor 23 is turned on, and the N-channel MOS transistor 24 is turned off. Therefore, the encoder unit 201 outputs a signal of H level to the matching line active signal line MLA1, and also outputs a signal of L level to the word line 151. Then, the signal of H level is outputted in the order from the encoder units 202 to 20n to the word lines 152 to 15n. In other words, when a signal of H level is inputted from the matching line 142 to the encoder unit 202, the encoder unit 202 outputs a signal of H level to the word line 152, and the encoder units 203 to 20n output signals of L level to the word lines 153 to 15n. When a signal of H level is inputted from the matching line 143 to the encoder unit 203, the encoder unit 203 outputs a signal of H level to the word line 153, and the encoder units 202, 204 to 20n output signals of L level to the word lines 152, 154 to 15n. In the same manner as described above, the signal of H level is outputted to the word lines 152 to 15n in the order closer to the lowest order encoder unit 201.

Therefore, when a signal of H level from any one of the matching lines 141 to 14n is inputted to the corresponding encoder unit 201 to 20n, only the corresponding encoder unit outputs a signal of H level to the corresponding word line, and the other encoder units output signals of L level to the corresponding word lines.

Moreover, when signals of H level are outputted from the matching lines 141 and 142 to the encoder units 201 and 202 and when signals of L level are inputted from the matching lines 143 to 14n to the encoder units 203 to 20n, the encoder unit 201 outputs a signal of H level to the word line 151. Then, since the signal of L level has been inputted from the matching line active signal line MLA1 thereto, the encoder unit 202 outputs a signal of L level to the word line 152. Based upon the signals of L level from the matching lines 143 to 14n, the encoder units 203 to 20n output signals of L level to the word lines 152 to 15n. In other words, only the lowest order encoder unit 201 is allowed to output a signal of H level to the word line 151. When signals of H level are inputted from the matching lines 141 to 14n to the other encoder units, the lowest order encoder unit outputs a signal of H level to the word line. Therefore, upon receipt of signals of H level from the plural matching lines, the priority encoder 20 allows the lowest order encoder unit to output a signal of H level to the word line.

Referring again to FIG. 1, the memory 30, which is made of a DRAM (Dynamic Random Access Memory), is connected to the priority encoder 20 through the word lines 151 to 15n. As described above, the priority encoder 20 to which signals of H level are inputted from the memory 10 through the matching lines 141 to 14n is allowed to output signals of H level to the word lines 151 to 15n corresponding to the matching lines 141 to 14n that have inputted the signals of H level.

Then, the memory 30 outputs content data from the memory cells connected to the word lines 151 to 15n from which the signals of H level has been outputted. Upon receipt of signals of H level from the memory 10 through the plural matching lines 141 to 14n, the priority encoder 20 outputs signals of H level to the word lines 151 to 15n corresponding to the matching lines 141 to 14n connected to the lowest order key data 1 to n among the matching lines 141 to 14n to which the signals of H level has been inputted. Then, the memory 30 outputs content data corresponding to the lowest order key data 1 to n.

When retrieval key data is inputted through the input-output terminal 60 so as to retrieve the corresponding content data, a control signal used for inputting the retrieval key data from the input-output terminal 60 to the memory 10 is inputted through the control terminal 70. Then, based upon the inputted control signal, the control circuit 50 controls the switching device 40 so that the switching device 40 outputs the retrieval key data input from the input-output terminal 60 to the memory 10.

Then, the memory 10 makes comparison as to whether or not the retrieval key data is matched with the stored key data as described above, and outputs signals of H level to the matching lines 141 to 14n corresponding to the key data matched with the retrieval key data. The priority encoder 20 outputs signals of H level to the word lines 151 to 15n corresponding to the matching lines 141 to 14n to which the signals of H level have been inputted. Thereafter, the control circuit 50 controls the switching device 40 so that the content data outputted from the memory 30 is outputted through the input-output terminal 60. Then, the memory 30 outputs the content data corresponding to the key data matched with the retrieval key data to the switching device 40 from the memory connected to the word lines to which the signals of H level have been outputted. Moreover, the switching device 40 outputs the inputted content data outputs outside from the input-output terminal 60. Thus, the retrieving operation of the content data corresponding to the retrieval key data is completed.

When the memory 10 output signals of H level from the plural matching lines 141 to 14n, the priority encoder 20 outputs signals of H level to the word lines corresponding to the matching lines connected to the lowest order key data, among the matching lines 141 to 14n to which the signals of H level have been inputted, as described above. Thus, the memory 30 outputs one piece of content data.

In the case when a postal code is stored as key data and names of people living in an address corresponding to the postal code are stored as content data, there may be a plurality of key data that are matched with retrieval key data. In this case, the priority encoder 20 outputs signals of H level to the word lines 151 to 15n so that among a plurality of names corresponding to one postal code, the name stored in the lowest order is outputted.

In accordance with the first embodiment, when key data matched with retrieval key data is extracted, content data corresponding to the key data is outputted so that without the need of generating an address to the content data corresponding to the extracted key data, the content data can be outputted. Moreover, when a plurality of key data are matched with the retrieval key data, the content data corresponding to the lowest order key data is outputted so that, even when a plurality of retrieving results exist, one piece of content data can be outputted.

Second Embodiment

Figure 4:
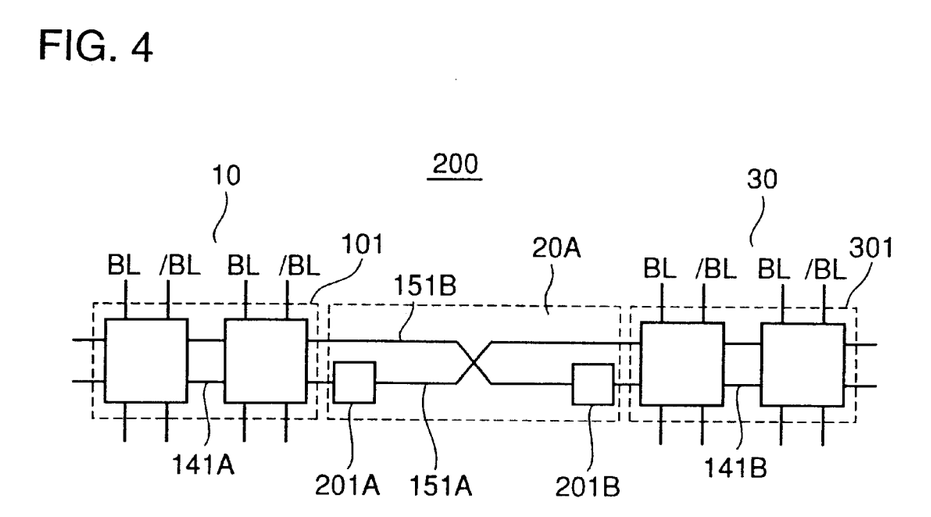
FIG. 4 is a schematic block diagram of a retrievable memory in accordance with the second embodiment of the present invention.

Referring to FIG. 4, a retrievable memory 200 in accordance with the second embodiment has an arrangement in which the priority encoder 20 of the retrievable memory 100 of the first embodiment is replaced by a priority encoder 20A. FIG. 4 shows a memory cell 101 for storing key data 1 and a memory cell 301 in a memory 30 for storing content data 1 corresponding to the key data 1, among key data 1 to n stored in the memory 10.

The priority encoder 20A includes encoder units 201A and 201B for carrying out bidirectional retrieves between the memory cell 101 and the memory cell 301. The encoder units 201A and 201B have the same circuit construction as the aforementioned encoder unit 201. The encoder unit 201A is connected to a matching line 141A of the memory cell 101 and a word line 151A of the memory cell 301, and functions as an encoder unit for specifying the content data 1 stored in the memory cell 301 based upon the key data 1 stored in the memory cell 101.

Moreover, the encoder unit 201B is connected to a matching line 141B of the memory cell 301 and a word line 151B of the memory cell 101, and functions as an encoder unit for specifying the key data 1 stored in the memory cell 101 based upon the content data 1 stored in the memory cell 301.

The memory cell 101, the matching line 141A, the encoder unit 201A, the word line 151A and the memory cell 301 have the same functions as the retrievable memory in accordance with the first embodiment, and the retrieving method thereof is the same as the method described above. Moreover, the memory cell 101, the matching line 141B, the encoder unit 201B, the word line 151B and the memory cell 301 execute the retrieving functions for key data based upon the content data, and the retrieving method thereof is the same as the method described above.

Therefore, with this arrangement, bidirectional retrieving processes are available between the key data and the content data.

Figure 5:
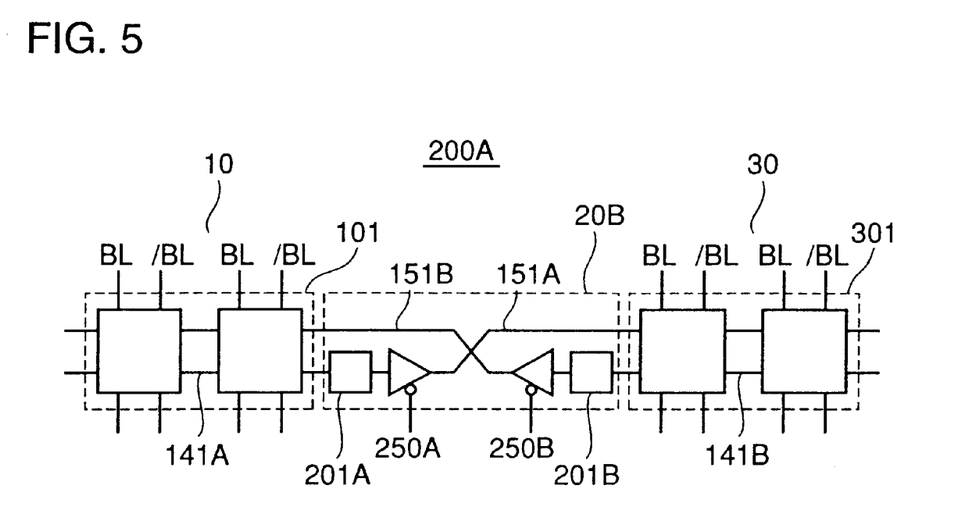
FIG. 5 is a schematic block diagram of another retrievable memory in accordance with the second embodiment of the present invention.

The retrievable memory in accordance with the second embodiment may be replaced by a retrievable memory 200A shown in FIG. 5. The retrievable memory 200A has an arrangement wherein the priority encoder 20A of the retrievable memory 200 shown in FIG. 4 is replaced by a priority encoder 20B. The priority encoder 20B is formed by adding a tristate buffers 250A and 250B to the priority encoder 20A. The application of the tristate buffers 250A and 250B makes it possible to prevent back flow of a signal outputted from the encoder units 201A and 201B at the time of retrieving content data from key data or retrieving key data from content data. Consequently, it becomes possible to ensure an accurate data retrieving process.

In FIGS. 4 and 5, only the encoder units 201A and 201B corresponding to one piece of key data and one piece of content data are shown; however, actually, the priority encoders 20A and 20B include n number of encoder units corresponding to n number of key data and content data. Moreover, upon receipt of signals of H level from a plurality of matching lines, the priority encoders 20A and 20B output signals of H level to the corresponding word lines so that the content data corresponding to the lowest order key data is read out among key data corresponding to the matching lines to which the signals of H level have been inputted, in the same manner as the priority encoder 20.

The other parts are the same as those of the first embodiment.

In accordance with the second embodiment, two priority encoders are placed between the two memories; therefore, the retrieving process of content data from key data and the retrieving process of key data from content data, that is, bidirectional data retrieving processes, can be carried out.

Third Embodiment

Figure 6:
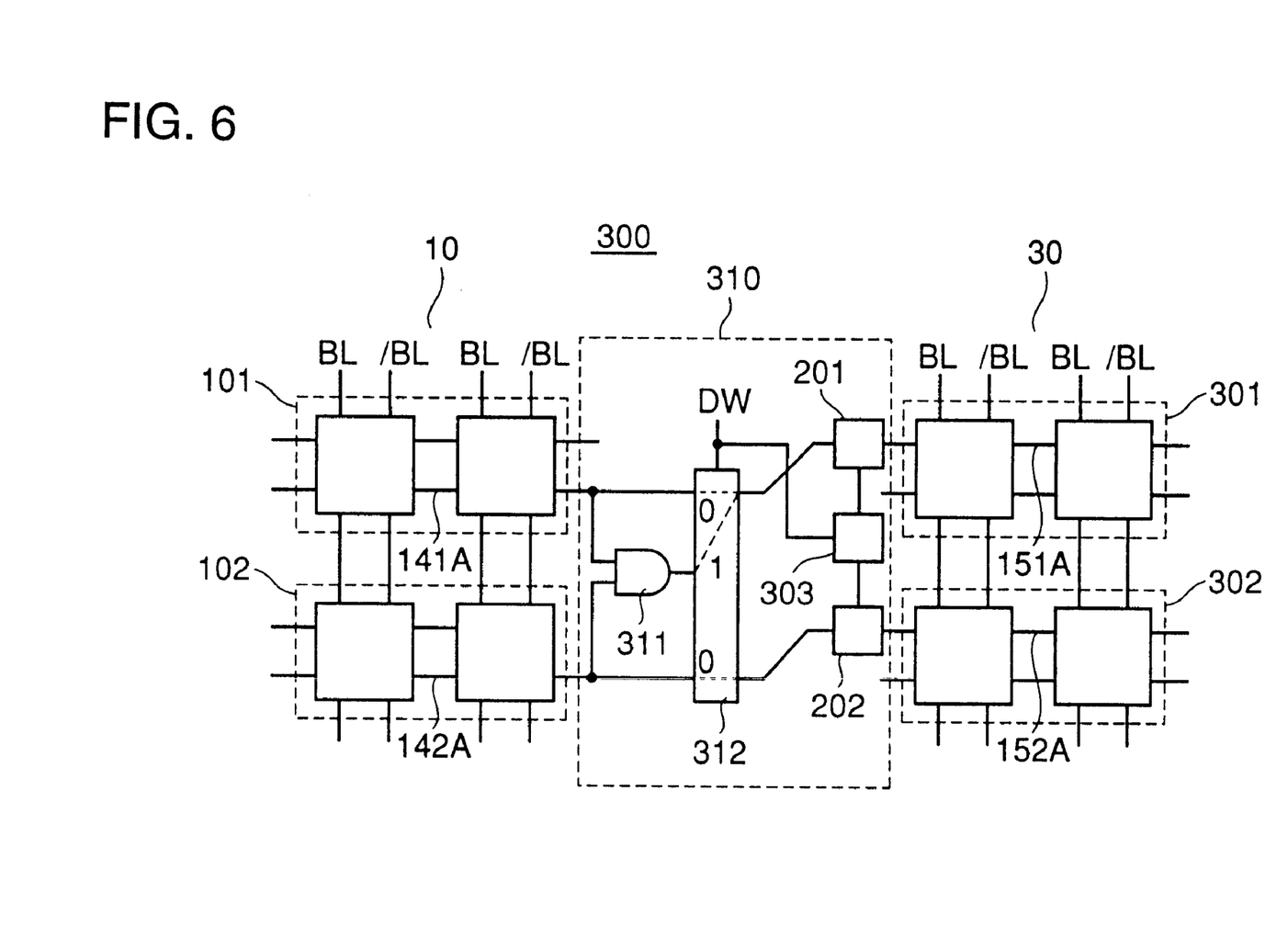
FIG. 6 is a schematic block diagram of a retrievable memory in accordance with the third embodiment of the present invention.

Referring to FIG. 6, a retrievable memory 300 in accordance with the third embodiment has an arrangement in which the priority encoder 20 of the retrievable memory 100 shown in FIG. 1 is replaced by a priority encoder 310. Here, the memory 10 stores a pair of key data, that is, key data stored in the memory cell 101 and key data stored in the memory cell 102. Then, the memory cell 301 of the memory 30 stores content data corresponding to the key data stored in the memory cell 101. Moreover, the memory cell 302 stores content data corresponding to the key data stored in the memory cell 102.

The priority encoder 310 is provided with encoder units 201 and 202, an AND gate 311, a selector 312 and a switching device 303. The AND gate 311 operates the logical product of a signal of the matching line 141A connected to the memory cell 101 and a signal of the matching line 142A connected to the memory cell 102, and outputs the result of the operation to the selector 312.

The selector 312 selects the signal from the matching line 141A, 142A or the output signal of the AND gate 311 in accordance with a control signal DW. In other words, the selector 312 selects the output signal of the AND gate 311 when the control signal DW is H level, and outputs the resulting signal to the encoder unit 201. In this case, the selector 312 outputs a signal of L level to the encoder unit 202. The AND gate 311 outputs the signal of H level when the signal of the matching line 141A and the signal of the matching line 142A is H level. In other words, the AND gate 311 outputs a signal of H level when the key data stored in the memory cell 101 and the key data stored in the memory cell 102 are matched with the retrieval key data.

Moreover, the control signal DW is L level, the selector 312 selects the signal of the matching line 141A and the signal of the matching line 142A, and outputs the respective signals to the encoder units 201 and 202.

When the control signal DW is H level, the switching device 303 cut away the encoder unit 201 from the encoder unit 202, and when the control signal DW is L level, it connects the encoder unit 201 with the encoder unit 202.

When a control signal DW of H level is inputted thereto and signals of H level are inputted thereto from the matching lines 141A and 142A, the selector 312 selects the output signal of H level from the AND gate 311, outputs a signal of H level to the encoder unit 201, and also outputs a signal of L level to the encoder unit 202. Then, the encoder unit 201 outputs a signal of H level to the word line 151A, as described above. In this case, since the switching device 303 cuts away the encoder unit 201 from the encoder unit 202, the encoder unit 202 is allowed to output a signal of L level to the word line 152A based upon the signal of L level from the selector 312. Thus, only the content data stored in the memory cell 301 is outputted. Consequently, the key data stored in the memory cell 101 and the content data corresponding to the key data stored in the memory cell 102 are outputted, thereby making it possible to double the length of the key data to be retrieved.

Moreover, when the control signal DW of H level is inputted thereto, a signal of H level is inputted thereto from the matching line 141A and a signal of L level is inputted thereto from the matching line 142A, the selector 312 selects the signal of L level from the AND gate 311, and outputs a signal of L level to the encoder units 201 and 202. Therefore, the encoder units 201 and 202 respectively output signals of L level to the word lines 151A and 152A. Thus, the content data stored in the memory cells 301 and 302 are not outputted.

Upon receipt of the control signal DW of L level, the selector 312 selects the signal of the matching line 141A and the signal of the matching line 142A, and respectively outputs these to the encoder units 201 and 202. In this case, the switching device 303 connects the encoder unit 201 with the encoder unit 202 based upon the L level signal. Upon receipt of the signal of H level from the matching line 141A as well as the signal of L level from the matching line 142A, a signal of H level is inputted to the encoder unit 201 and a signal of L level is inputted to the encoder unit 202. Then, the encoder unit 201 outputs a signal of H level to the word line 151A, and the encoder unit 202 outputs a signal of L level to the word line 152A. Thus, the content data corresponding to the key data stored in the memory cell 101 is outputted.

Upon receipt of signals of H level from the matching lines 141A and 142A, the selector 312 outputs a signal of H level to the encoder units 201 and 202. Then, the encoder unit 201 outputs a signal of H level to the word line 151A, and also outputs the matching line active signal of L level to the switching device 303. In this case, since the switching device 303 connects the encoder unit 201 with the encoder unit 202, the signal of L level inputted from the encoder unit 201 is outputted to the encoder unit 202. Then, encoder unit 202 outputs a signal of L level to the word line 152A. Consequently, among the plurality of key data that is matched with the retrieval key data, only the content data corresponding to the lowest order key data is outputted.

FIG. 6 shows the encoder units 201 and 202, the AND gate 311, the selector 312 and the switching device 303 that deal with the pair of key data consisting of key data stored in the memory cell 101 and key data stored in the memory cell 102; however, actually, the priority encoder 310 includes two encoder units, an AND gate, a selector and a switching device that deal with each of a plurality of pairs of key data.

As described above, in the retrievable memory 300, the logic of the control signal DW is switched so that the length of the retrieval key data can be selectively switched between the original length and double the original length.

Figure 7:
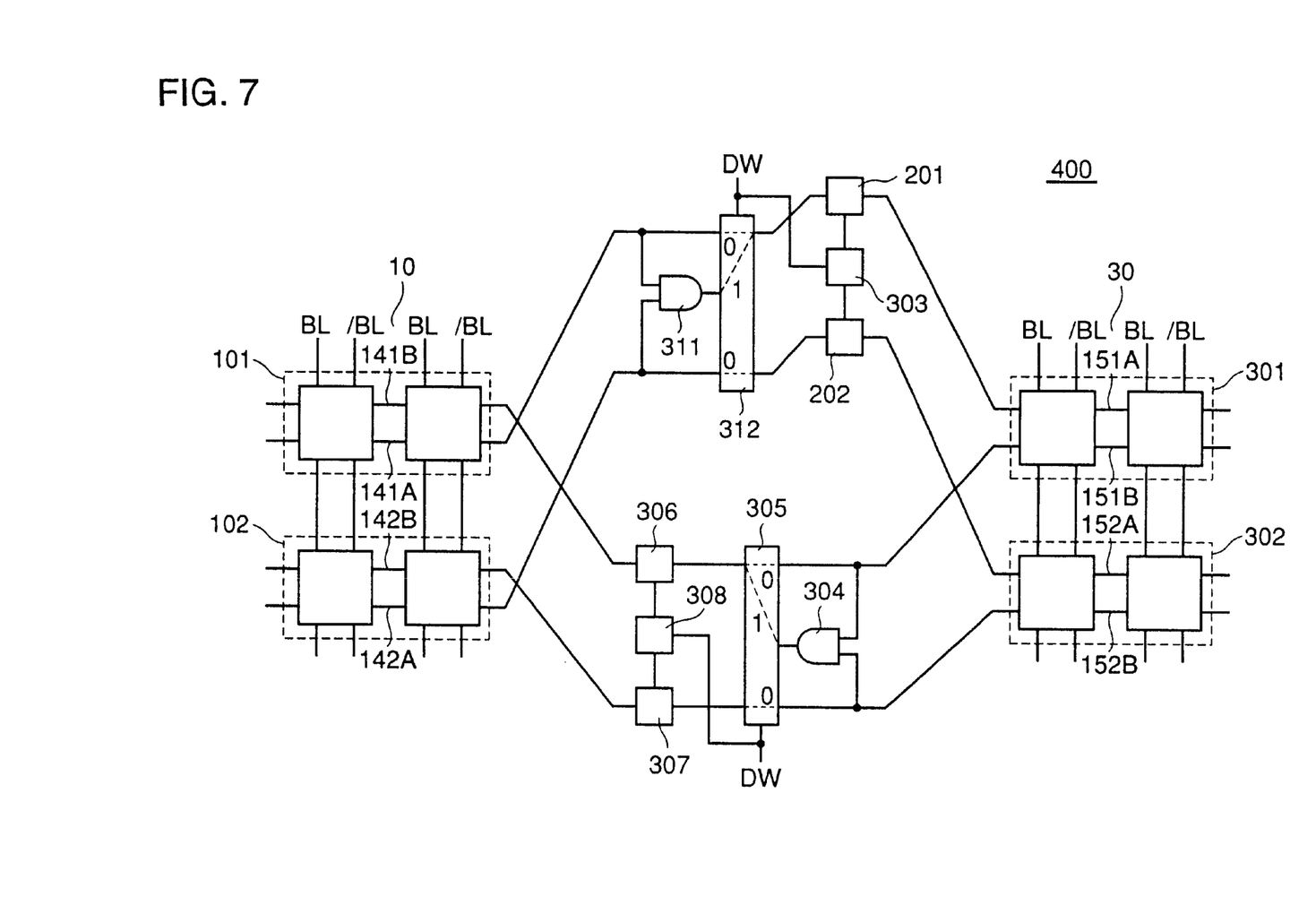
FIG. 7 is a schematic block diagram of another retrievable memory in accordance with the third embodiment of the present invention.

The retrievable memory of the third embodiment may be provided as a retrievable memory 400 shown in FIG. 7. The retrievable memory 400 is formed by adding, to the retrievable memory 300 of FIG. 6, an AND gate 304, a selector 305, encoder units 306 and 307, and a switching device 308; and the other structure is the same as that of the retrievable memory 300.

The AND gate 304, the selector 305, the encoder units 306 and 307, and the switching device 308 respectively have the same functions as the AND gate 311, the selector 312, the encoder units 201 and 202 and the switching device 303.

The retrievable memory 400 selectively switches the length of the retrieval key data by using the memory cells 101 and 102, the encoder units 201 and 202, the AND gate 311, the selector 312, the switching device 303 and the memory cells 301 and 302, thereby reading out the content data corresponding to the key data that is matched with the retrieval key data. Moreover, the retrievable memory 400 selectively switches the length of the content retrieval data by using the memory cells 101 and 102, the encoder units 306 and 307, the AND gate 304, the selector 305, the switching device 308 and the memory cells 301 and 302, thereby reading out the key data corresponding to the content data that is matched with the content retrieval data. In other words, the retrievable memory 400 selectively switches the length of the retrieval data so that the bidirectional retrieving operations are available between the key data and the content data.

With respect to the data retrieval system shown in FIG. 6 and FIG. 7 in which a pair of the key data and the content data are made to correlate with each other, for example, a data retrieval system in which the upper three digits and the lower four digits of the postal code are stored as a pair of key data has been proposed.

In a retrieving process using only the upper three digits, there is a possibility that a plurality of people are extracted as a result of the retrieving process, however, in this system when the upper three digits and the lower four digits are matched with each other, a person living in the address corresponding to the postal code is outputted. Thus, it is possible to ensure an accurate retrieving process.

In accordance with the third embodiment, since the selector which can selectively switch the length of the retrieval data is placed between the key data and the content data, it is possible to carry out a data retrieving process while selectively changing the length of the retrieval data.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A retrievable memory comprising:
    a first memory storing n number (n: natural number) of key data, and outputting a first matching signal when inputted retrieval key information is matched with stored key data;
    a second memory storing n number of content data corresponding to said n number of key data, and outputting a second matching signal when inputted content retrieval information is matched with stored content data;
    a priority encoder specifying, upon receipt of said first matching signal, said content data stored in said second memory corresponding to said key data matched with said retrieval key information, and specifying, upon receipt of said a second matching signal, key data stored in said first memory corresponding to said content data matched with said content retrieval information,
    wherein said priority encoder outputs a first specifying signal for specifying single content data upon receipt of a plurality of first matching signals, and outputs a second specifying signal for specifying single key data upon receipt of a plurality of second matching signals,
    said second memory outputs said content data specified by said a first specifying signal, and
    said first memory outputs said key data specified by said a second specifying signal.

2. The retrievable memory according to claim 1, wherein said first memory stores n number of key data in an ordered manner,
    said second memory stores n number of content data in an ordered manner, and
    said priority encoder outputs a first specifying signal for specifying content data corresponding to said the lowest order key data among m number (m: natural number not more than n) of key data matched with said retrieval key information when m number of said first matching signals are inputted from said first memory, and outputs a second specifying signal for specifying key data corresponding to said the lowest order content data among k number (k: natural number not more than n) of content data matched with said content retrieval information when k number of said second matching signals are inputted from said second memory.

3. The retrievable memory according to claim 2, wherein said first memory outputs m number of first logical signals and n−m number of second logical signals when said retrieval key information is matched with m number of key data, said second memory outputs k number of third logical signals and n−k number of fourth logical signals when said content retrieval information is matched with k number of content data, said priority encoder outputs in response to said first logical signal a first activation signal for reading out said content data corresponding to said the lowest order key data to said second memory, and outputs in response to said third logical signal a second activation signal for reading out said key data corresponding to said the lowest order content data to said first memory, said first memory outputs said key data corresponding to said the lowest order content data based on said second activation signal, and said second memory outputs said content data corresponding to said the lowest order key data based on said first activation signal, said first logical signal is generated in accordance with said the lowest order key data among said inputted m number of first logical signals, said third logical signal is generated in accordance with said the lowest order key data among said inputted k number of third logical signals.

* * * * *